US012500602B2

(12) United States Patent
Cho

(10) Patent No.: US 12,500,602 B2
(45) Date of Patent: Dec. 16, 2025

(54) COMPENSATION DEVICE AND METHOD FOR EXCESS LOOP DELAY USING TIME DIVISION SWITCHING TECHNIQUE

(71) Applicant: THE INDUSTRY & ACADEMIC COOPERATION IN CHUNGNAM NATIONAL UNIVERSITY, Daejeon (KR)

(72) Inventor: Young-Kyun Cho, Daejeon (KR)

(73) Assignee: The Industry & Academic Cooperation Chungnam National University, Daejeon (KR)

( * ) Notice: Subject to any disclaimer, the term of this patent is extended or adjusted under 35 U.S.C. 154(b) by 174 days.

(21) Appl. No.: 18/517,241

(22) Filed: Nov. 22, 2023

(65) Prior Publication Data

US 2025/0141468 A1    May 1, 2025

(30) Foreign Application Priority Data

Oct. 25, 2023  (KR) .......................... 10-2023-0143597

(51) Int. Cl.
  *H03M 3/00*    (2006.01)
(52) U.S. Cl.
  CPC .............. *H03M 3/37* (2013.01); *H03M 3/39* (2013.01); *H03M 3/422* (2013.01); *H03M 3/432* (2013.01); *H03M 3/436* (2013.01); *H03M 3/452* (2013.01); *H03M 3/454* (2013.01); *H03M 3/458* (2013.01)
(58) Field of Classification Search
  CPC ........ H03M 3/37; H03M 3/432; H03M 3/436; H03M 3/452; H03M 3/454; H03M 3/458; H03M 3/39; H03M 3/422

USPC .......................................... 341/118, 143, 155
See application file for complete search history.

(56) References Cited

U.S. PATENT DOCUMENTS 9,800,261 B2 * 10/2017 Cho ....................... H03M 3/454
10,063,252 B2 * 8/2018 Cho ....................... H03M 3/394

FOREIGN PATENT DOCUMENTS

| KR | 10-2018-0085996 A | 7/2018 |
| KR | 10-2023-0107436 A | 7/2023 |
| KR | 10-2583962 B1 | 9/2023 |

OTHER PUBLICATIONS

Office Action from the Korean Patent Office in a counterpart application, Sep. 3, 2024 (4 pages).

* cited by examiner

*Primary Examiner* — Khai M Nguyen
(74) *Attorney, Agent, or Firm* — You & IP, LLC

(57) ABSTRACT

Proposed is a technology related to a compensation method for excess loop delay (ELD) using a time division switching (TDS) technique. A delta-sigma modulator (DSM) to which the compensation method for excess loop delay is applied includes a single op-amp resonator (SOR) loop filter. The loop filter includes an operational amplifier, a plurality of capacitors connected to each other in series between an input terminal and an output terminal of the operational amplifier, and a plurality of resistor units connected in common to one among nodes between the plurality of capacitors. For at least two of the plurality of resistor units, a resistance value of each of the at least two resistor units is changed according to a clock signal, and a coefficient of a third-order transfer function of the loop filter is changed according to the clock signal, thereby effectively compensating for excess loop delay of the delta-sigma modulator.

17 Claims, 12 Drawing Sheets

COMPENSATION DEVICE AND METHOD FOR EXCESS LOOP DELAY USING TIME DIVISION SWITCHING TECHNIQUE

CROSS REFERENCE TO RELATED APPLICATION

The present application claims priority to Korean Patent Application No. 10-2023-0143597, filed Oct. 25, 2023, the entire contents of which is incorporated herein for all purposes by this reference.

BACKGROUND OF THE INVENTION

Field of the Invention

The present disclosure relates to a technology for compensating for excess loop delay in a delta-sigma modulator. In particular, the present disclosure relates to a loop filter and a delta-sigma modulator using the same, wherein the loop filter compensates for excess loop delay by switching a transfer function using a time division switching technique.

Description of the Related Art

A delta-sigma modulator (DSM) is a circuit that converts an analog input into digital pulses. The delta-sigma modulator (DSM) controls pulses so that the average value of digital pulses is equal to the average value of analog input values. The delta-sigma modulator (DSM) is an oversampling converter that samples digital data multiple times. Therefore, the DSM can minimize quantization noise, and can perform analog-to-digital conversion with relatively high resolution. Due to these characteristics, the delta-sigma modulator (DSM) is used to improve the efficiency of various wireless communication systems.

In the internal feedback path of the delta-sigma modulator (DSM), excess loop delay (ELD) occurs due to the operating time of a control circuit, such as a quantizer and a transistor. In particular, when the conversion bandwidth and the sampling clock rate are high, the excess loop delay (ELD) impairs the stability of the DSM and reduces resolution. Therefore, compensation for excess loop delay (ELD) is essential in a high-speed continuous-time (CT) DSM.

To compensate for excess loop delay (ELD) of delta-sigma modulator (DSM), a direct feedback path is inserted after the last integrator, so that an additional fast feedback loop can be realized around a quantizer. However, this configuration uses a summing amplifier requiring a wide bandwidth, so has a problem of increased power consumption. Therefore, there is a need to develop a delta-sigma modulator (DSM) and a loop filter that are efficient with low power consumption and are capable of compensating for excess loop delay (ELD).

Korean Patent No. 10-2583962, issued 27 Sep. 2023, relates to "CONTINUOUS DELTA-SIGMA MODULATOR FOR SUPPORTING MULTI MODE". The loop filter disclosed in Korean Patent No. 10-2583962 includes a single operational amplifier and a circuit including at least one capacitor, at least one resistor, and at least one switch connected to the operational amplifier. In particular, the loop filter enables a signal transfer characteristic to satisfy a third-order transfer function or a second-order transfer function through the ON/OFF adjustment of the at least one switch, so that the delta-sigma modulator can operates in multi-mode.

Korean Patent Application Publication 10-2023-0107436, published 17 Jul. 2023, relates to "DELTA-SIGMA MODULATORS AND MODULATION METHODS THEREOF". The delta-sigma modulator disclosed in Korean Patent Application Publication No. 10-2023-0107436 includes a first-order integrator, a second-order integrator, and a third-order integrator. In particular, the first to third-order integrators connected in cascade include one or more discrete-time (DT) integrators and one or more continuous-time (CT) integrators. Disclosed are a hybrid DT/CT delta-sigma modulator and a modulation method thereof, combined with a DT delta-sigma modulator structure that has less clock jitter and excess loop delay (ELD) and coefficient change problems.

However, a specific circuit configuration that efficiently performs compensation for excess loop delay (ELD) using a time division switching technique in a delta-sigma modulator (DSM) has not yet been disclosed.

The foregoing is intended merely to aid in the understanding of the background of the present disclosure, and is not intended to mean that the present disclosure falls within the purview of the related art that is already known to those skilled in the art.

Documents of Related Art (Patent Document 1) KR 10-2583962 B1 (27 Sep. 2023); and
(Patent Document 2) KR 10-2023-0107436 A (17 Jul. 2023).

SUMMARY OF THE INVENTION

The present disclosure is directed to providing a loop filter and a delta-sigma modulator (DSM) that are capable of efficiently compensating for excess loop delay (ELD).

In addition, the present disclosure is directed to providing a loop filter and a delta-sigma modulator (DSM) that are capable of efficiently compensating for excess loop delay (ELD) by reconfiguring a transfer function according to a clock signal.

It is to be understood that problems to be solved by the present disclosure are not limited to the aforementioned problems and other problems which are not mentioned will be apparent from the following description to a person with an ordinary skill in the art to which the present disclosure pertains.

According to an aspect of the present disclosure, a communication terminal capable of compensating for excess loop delay by using a time division switching technique includes a delta-sigma modulator. The delta-sigma modulator includes a loop filter that has a signal transfer characteristic satisfying a third-order transfer function and compensates for excess loop delay.

According to another aspect of the present disclosure, a delta-sigma modulator capable of compensating for excess loop delay by using a time division switching technique includes a loop filter that has a signal transfer characteristic satisfying a third-order transfer function and compensates for excess loop delay.

The delta-sigma modulator includes: a loop filter configured to integrate a difference between an input signal and an analog signal for output; a quantizer configured to quantize a signal output from the loop filter for output; and a digital-to-analog converter (DAC) configured to perform digital-to-analog conversion on a signal output from the quantizer to output the analog signal.

According to still another aspect of the present disclosure, a loop filter capable of compensating for excess loop delay by using a time division switching technique has a signal transfer characteristic satisfying a third-order transfer function and compensates for excess loop delay.

The loop filter includes: an operational amplifier; a plurality of capacitors connected to each other in series between an input terminal and an output terminal of the operational amplifier; and a plurality of resistor units connected in common to one among nodes between the plurality of capacitors. At least two of the plurality of resistor units have respective resistance values changed according to a clock signal.

According to an additional aspect, as the resistance values of the two resistor units are changed, a coefficient of the highest order term in a numerator of the third-order transfer function of the loop filter may be changed.

According to an additional aspect, the resistance value of one of the two resistor units may be changed to increase when the clock signal is high, or the resistance value of the other resistor unit may be changed to increase when the clock signal is low.

According to an additional aspect, each of the two resistor units may include: a plurality of resistors; and a switch connected to at least one of the plurality of resistors, and configured to determine the resistance value based on the clock signal.

According to an additional aspect, for each of the two resistor units, the plurality of resistors and the switch may be connected in the same configuration, the switch of one of the two resistor units may receive the clock signal, and the switch of the other resistor unit may receive an inverted clock signal.

According to an additional aspect, the switch may be a transistor, two of the plurality of resistors included in each of the two resistor units may be connected in series, and one of the two resistors connected in series in each of the resistor units may have opposite ends connected to two terminals of the switch of each of the resistor units.

The plurality of resistor units may include: a first resistor set placed between an inversion input terminal of the loop filter and the output terminal of the operational amplifier, and including three resistor units connected to a first node in common between a first capacitor and a second capacitor among the plurality of capacitors; and a second resistor set placed between an input terminal of the loop filter and an inversion output terminal of the operational amplifier, and including three resistor units connected to a second node in common between the second capacitor and a third capacitor among the plurality of capacitors.

According to an additional aspect, the second resistor set may include: a third resistor unit placed between the second node and a ground; a fifth resistor unit connected to the second node and the inversion output terminal of the operational amplifier; and a seventh resistor unit placed between the second node and the input terminal of the loop filter. The clock signal may change the resistance values of the seventh resistor unit and the third resistor unit.

According to an additional aspect, the third resistor unit and the seventh resistor unit may include: a plurality or resistors; and a switch connected to at least one of the plurality of resistors, and configured to determine the resistance value based on the clock signal.

According to an additional aspect, a first switch of the third resistor unit may have two terminals connected to opposite ends of at least one resistor included in the third resistor unit, a second switch of the seventh resistor unit may have two terminals connected to opposite ends of at least one resistor included in the seventh resistor unit, the first switch and the second switch may be controlled by the clock signals, and one of the clock signals input to the first switch and the second switch may be input in an inverted manner.

The compensation device and method for excess loop delay according to the present disclosure achieve low power consumption by using the time division switching technique in which the transfer function is reconfigured according to the clock signal, thereby efficiently compensating for excess loop delay (ELD).

The loop filter and the delta-sigma modulator (DSM) according to the present disclosure have an excellent signal-to-noise ratio performance even when great excess loop delay (ELD) occurs.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
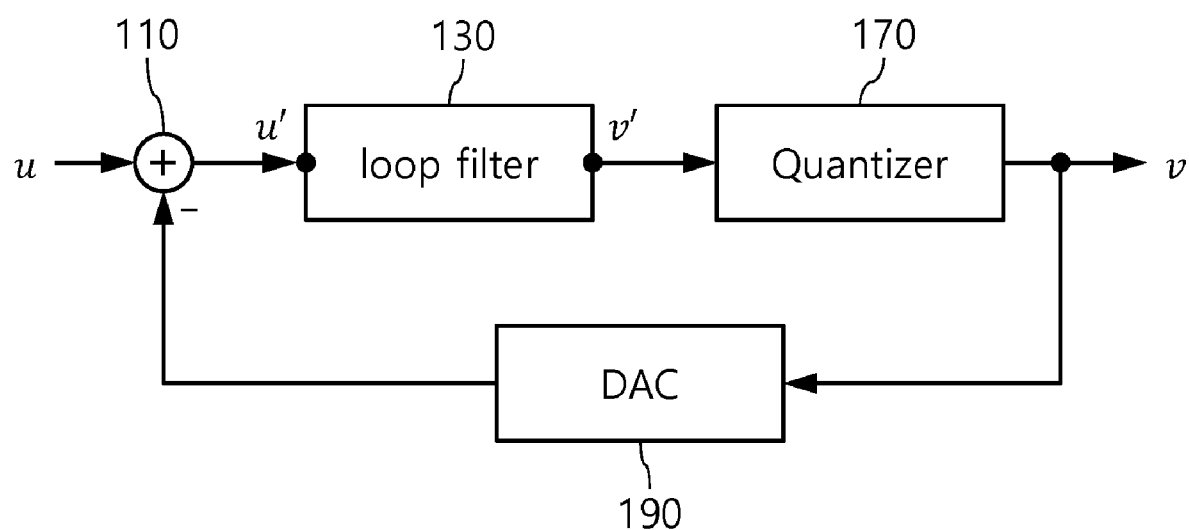
FIG. 1 is a configuration diagram illustrating the schematic configuration of a delta-sigma modulator according to an embodiment.

The foregoing and additional aspects are embodied through embodiments described with reference to the accompanying drawings. It is understood that elements of each embodiment may be variously combined within the embodiment or with elements of another embodiment without other mentions or contradiction with each other. Terms used in the specification and claims should be interpreted as means and a concept consistent with a description or proposed technical spirit based on the principle that the inventor may appropriately define the concept of terms to describe the disclosure thereof in the best way. In the specification, a module or a part may be a set of program instructions stored in a memory to be executed on a computer or a processor, or may be realized using a set of electronic components or circuits such as an ASIC or an FPGA to execute the instructions. In addition, the operation of each module or part may be performed by one or a plurality of processors or devices. Elements denoted by the same or similar reference numerals perform the same or similar functions, so a description thereof may be omitted. For elements with reference numerals of which descriptions are omitted, the content previously described for the elements denoted by the same or similar reference numerals may be referred to.

Hereinafter, preferred embodiments of the present disclosure will be described with reference to the accompanying drawings.

FIG. 1 is a configuration diagram illustrating the schematic configuration of a delta-sigma modulator according to an embodiment.

The delta-sigma modulator (DSM) according to the embodiment includes an adder 110, a loop filter 130, a quantizer 170, and a digital-to-analog converter (DAC) 190.

The adder 110 transmits, to the loop filter 130, an error signal (u') obtained by subtracting an output signal of the DAC 190 from an input signal (u) input from the outside of the delta-sigma modulator (DSM).

The loop filter 130 receives a loop filter input signal (u') at the input terminal of the loop filter 130 and transmits a loop filter output signal (v') at the output terminal of the loop filter 130 to the quantizer 170. The loop filter includes integrators to accumulate the input error signal (u'). When integrators are arranged in a cascade structure, the order of the transfer function is as high as the number of integrators and the signal-to-noise ratio performance is improved. However, the higher the order of the transfer function, the lower the state stability. Therefore, a third-order integrator is generally used.

In the meantime, when an integrator is realized using an operational amplifier, there are problems that the circuit area of the operational amplifier, which is an active element, is large and power consumption is large. In order to solve the problems, a higher-order loop filter may be realized using a single op-amp resonator (SOR) including one operational amplifier 350.

The quantizer 170 quantizes a signal (v') output from the loop filter and outputs an output signal (v) of the delta-sigma modulator. The quantizer performs quantization according to the sampling frequency (fs), which is the frequency of an input clock signal (CK). The quantizer 170 compares the output signal (v') of the loop filter to a reference value and outputs the output signal (v).

The DAC 190 converts a digital signal (v) output from the quantizer 170 into an analog signal and outputs the analog signal. The analog signal may be realized with a 1-bit DAC, or may be realized with more bits. The DAC 190 may include a comparator. A signal fed back by the DAC may be realized in the form of Non Return to Zero (NRZ) or Return to Zero (RZ). The DAC 190 may be realized as a voltage control current source.

Figure 2:
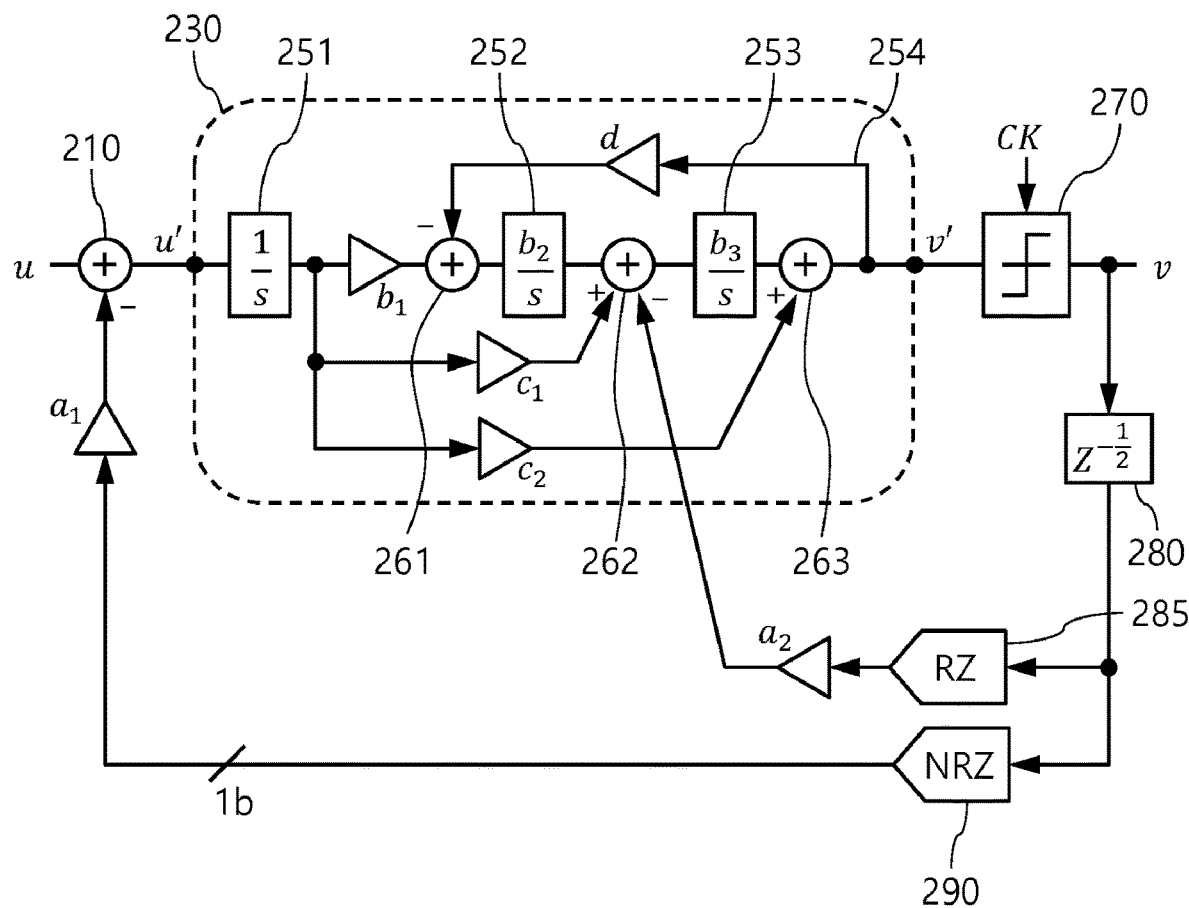
FIG. 2 is a configuration diagram illustrating the configuration of a delta-sigma modulator for compensating for excess loop delay according to a first embodiment.

FIG. 2 is a configuration diagram illustrating the configuration of a delta-sigma modulator for compensating for excess loop delay according to a first embodiment.

The delta-sigma modulator (DSM) for compensating for excess loop delay (ELD) according to the first embodiment includes an adder 210, a loop filter 230, a quantizer 270, a signal delay circuit 280, a RZ DAC 285, and an NRZ DAC 290.

The adder 210 inputs, to the loop filter 230, an error signal (u') obtained by amplifying a 1-bit signal output from the NRZ DAC 290 by $a_1$ times and subtracting the amplified signal from an analog input signal (u) input to the delta-sigma modulator (DSM).

The loop filter 230 includes three integrators 251, 252, and 253, and has a signal transfer characteristic satisfying a third-order transfer function. The loop filter 230 includes three adders 261, 262, and 263.

A first integrator 251 integrates the error signal (u') input to the input terminal of the loop filter and outputs the integrated signal. The output integral signal is amplified by $b_1$ times and the amplified signal is input to a first adder 261. The first adder 261 outputs, to a second integrator 252, a signal obtained by subtracting a signal resulting from amplifying the output signal (v') of the loop filter by d times through a feedback path 254 from the input signal that has passed through the first integrator 251 and has been amplified by $b_1$ times. The second integrator 252 integrates the input signal, amplifies the integrated signal by $b_2$ times, and outputs the amplified signal to a second adder 262. The second adder 262 adds the signal input from the second integrator 252 to a signal resulting from amplifying the signal output from the first integrator 251 by $c_1$ times. Then, the second adder 262 subtracts, from a result of the addition, a signal obtained by amplifying an output signal of the RZ DAC 285 by $a_2$ times. The second adder 262 outputs a result of the subtraction to a third integrator 253. The third integrator 253 integrates the input signal, amplifies the integrated signal by $b_3$ times, and outputs the amplified signal to a third adder 263. The third adder 263 adds the signal input from the third integrator to a signal resulting from amplifying the signal output from the first integrator 251 by $c_2$ times, and outputs a result of the addition as the output signal (v') of the loop filter.

The loop filter 230 includes two paths for feeding forward (FF) the signal that has passed through the first integrator, to the second adder and to the third adder. In addition, the loop filter 230 further includes one path 254 that feeds back the output signal of the loop filter in a subtraction (−) manner to the first adder in order to compensate for excess loop delay (ELD). In the meantime, a current signal output from the RZ DAC 285 is input to the second adder in a subtraction (−) manner in order to compensate for excess loop delay (ELD).

The quantizer 270 performs quantization on the output signal (v') of the loop filter 230 at every sampling period according to the clock signal (CK) and outputs the digital output signal (v) of the delta-sigma modulator (DSM) to the outside.

The signal delay circuit 280 delays the output signal (v) of the delta-sigma modulator (DSM) for a predetermined period of time and outputs the same. In FIG. 2, the signal delay circuit 280 delays the output signal (v) by half (½) the period of the clock signal (CK). The signal delay circuit 280 may be realized using a latch.

The RZ DAC 285 receives the half-clock delayed digital output signal output from the signal delay circuit 280, encodes the signal in a return-to-zero (RZ) manner, and outputs the encoded signal. The output signal is amplified by $a_2$ times and the amplified signal is input to the second adder 262.

The NRZ DAC 290 receives the half-clock delayed output signal output from the signal delay circuit 280, encodes the signal in a non-return-to-zero (NRZ) manner, and outputs the encoded signal. Referring to FIG. 2, the NRZ DAC performs 1-bit DA conversion.

The signal delay circuit 280 delays the output signal (v) by half a clock and the RZ DAC 285 feeds back the signal to the second adder, thereby performing the operation of compensating for excess loop delay (ELD).

From the circuit of FIG. 2, the transfer function of the loop filter 230 may be obtained as shown in Equation 1 below.

$$TH = \frac{v'}{u'} = \frac{c_2 s^2 + b_3 c_1 s + b_1 b_2 b_3}{s(s^2 + b_2 b_3 d)} \quad \text{[Equation 1]}$$

Referring to Equation 1, the highest order term in the denominator is s cubed ($s^3$), so the signal transfer characteristic of the loop filter satisfies the third-order transfer function.

The signal (u') obtained by subtracting a feedback signal from the analog input signal (u) by the adder 210 is input to the input terminal of the loop filter. The loop filter 230 integrates the error signal (u') and transmits the loop filter output signal (v') to the quantizer 270. The quantizer 270 performs quantization according to the clock signal (CK), and outputs the digital output signal (v). The digital output signal (v) is subjected to digital-to-analog (DA) conversion by the NRZ DAC to be fed back to the analog input signal (u). In order to compensate for excess loop delay (ELD), the signal delay circuit 280 delays the output signal (v) by half a clock and the RZ DAC 285 performs the operation of feeding back the signal to the second adder 262. The second adder 262 outputs, to the third integrator 253, a signal obtained by subtracting the signal output from the RZ DAC 285 from the signal input from the second integrator 252.

Figure 3A:
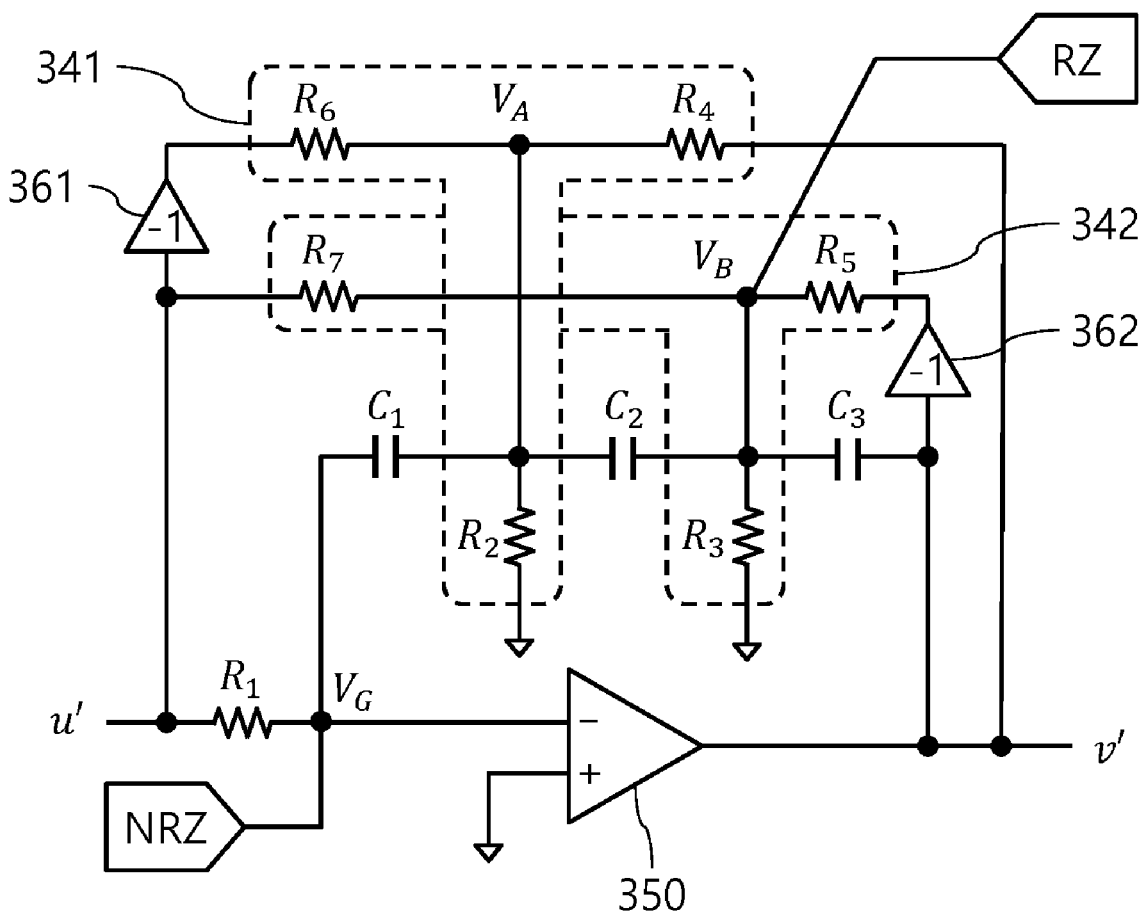
FIG. 3A is a single-ended circuit diagram illustrating the loop filter of the delta-sigma modulator for compensating for excess loop delay according to the first embodiment, the loop filter being realized using a single operational amplifier.

FIG. 3A is a single-ended circuit diagram illustrating the loop filter of the delta-sigma modulator for compensating for excess loop delay according to the first embodiment, the loop filter being realized using a single operational amplifier. The single-ended circuit of FIG. 3A may be realized as a differential circuit of FIG. 3B. Hereinafter, for convenience of description, a single-ended circuit is mainly used for description, but those skilled in the art can easily realize the embodiments as differential circuits.

According to a modification of the first embodiment, the loop filter 330*a* may be realized using one operational amplifier 350. Referring to FIG. 3A, the loop filter 330*a* includes one operational amplifier 350, a first inversion circuit 361, a plurality of resistor units, a second inversion circuit 362, a first resistor ($R_1$), and a plurality of capacitors ($C_1$, $C_2$, and $C_3$). The loop filter 330*a* receives an input signal (u') at the input terminal of the loop filter 330*a*, and outputs an output signal (v') at the output terminal of the loop filter 330*a*.

In general, when a third-order loop filter is realized, the third-order loop filter may be realized by connecting three operational amplifiers in cascade. However, when three operational amplifiers are used, there are problems that the circuit area of the operational amplifiers, which are active elements, is large and power consumption is large. Therefore, as shown in FIG. 3A, configuring a loop filter circuit with a single op-amp resonator (SOR) using one operational amplifier 350 is advantageous in terms of power consumption and circuit integration.

The first resistor ($R_1$) is placed between the input terminal to which the loop filter input signal (u') is input and an inversion input terminal ($V_G$) of the operational amplifier 350.

The plurality of capacitors ($C_1$, $C_2$, and $C_3$) are placed between the inversion input terminal ($V_G$) of the operational amplifier 350 and an output terminal of the operational amplifier 350 from which the output signal (v') is output. The plurality of capacitors ($C_1$, $C_2$, and $C_3$) are connected to each other in series. A first capacitor ($C_1$) is connected to the inversion input terminal ($V_G$) of the operational amplifier 350, a third capacitor ($C_3$) is connected to the output terminal of the operational amplifier 350, and a second capacitor ($C_2$) is connected to the first capacitor ($C_1$) and the third capacitor ($C_3$) in series therebetween.

Figure 3B:
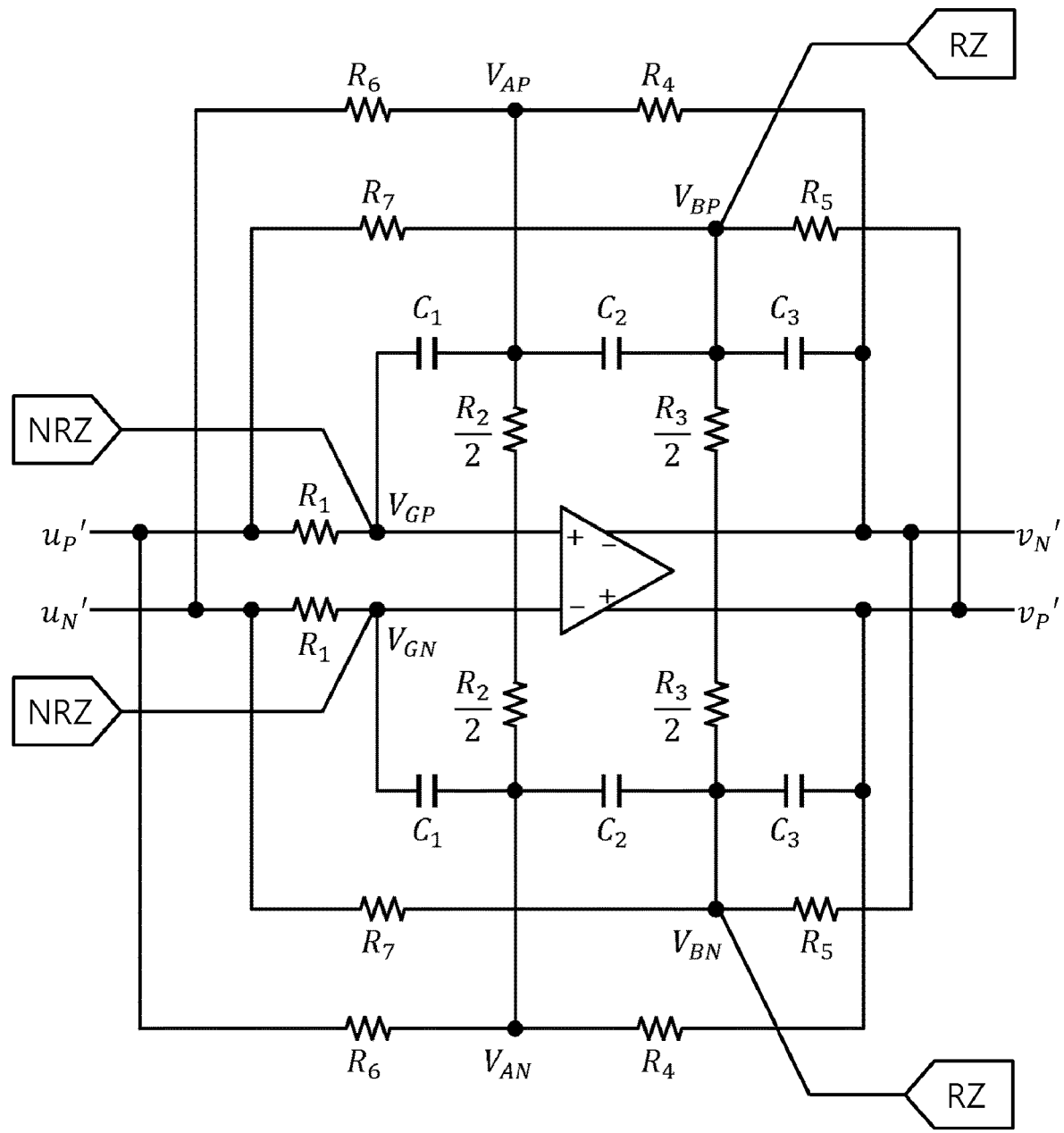
FIG. 3B is a circuit diagram of a differential circuit illustrating the loop filter of the delta-sigma modulator for compensating for excess loop delay according to the first embodiment, the loop filter being realized using a single operational amplifier.

The operational amplifier 350 operates as an integrator because of the first resistor ($R_1$) connected to the inversion input terminal and the capacitors ($C_1$, $C_2$, and $C_3$) placed between the inversion input terminal and the output terminal. Referring to FIG. 3B, the operational amplifier may operate as a differential amplifier including two input terminals.

The plurality of resistor units include a first resistor set 341 and a second resistor set 342. The first resistor set 341 is placed between the output terminal (the inversion input terminal of the loop filter) of the first inversion circuit 361 and the output terminal of the operational amplifier 350, and is connected to a first node ($V_A$) between the first capacitor ($C_1$) and the second capacitor ($C_2$). The first resistor set 341 includes three resistor units ($R_2$, $R_4$, and $R_6$) connected to the first node ($V_A$) in common. A second resistor ($R_2$) is placed between the first node ($V_A$) and the ground, a fourth resistor ($R_4$) is placed between the first node ($V_A$) and the output terminal of the operational amplifier 350, and a sixth resistor ($R_2$) is placed between the first node ($V_A$) and the output terminal of the first inversion circuit 361. The first inversion circuit 361 transmits an inverted signal of which the phase is opposite to the phase of the signal (u') input to the loop filter, to the sixth resistor ($R_6$) of the first resistor set 341.

The second resistor set 342 is placed between the input terminal of the loop filter and the output terminal (an inversion output terminal of the operational amplifier) of the second inversion circuit 362, and is connected to a second node ($V_B$) between the second capacitor ($C_2$) and the third capacitor ($C_3$). The second resistor set 342 includes three resistor units ($R_3$, $R_5$, and $R_7$) connected to the second node ($V_B$) in common. A third resistor ($R_3$) is placed between the second node ($V_B$) and the ground, a fifth resistor ($R_5$) is placed between the second node ($V_B$) and the output terminal of the second inversion circuit 362, and a seventh resistor ($R_7$) is placed between the second node ($V_B$) and the input terminal of the loop filter. The second inversion circuit 362 transmits an inverted signal of which the phase is opposite to the phase of the signal (v') output from the output terminal of the operational amplifier 350, to the fifth resistor ($R_5$) of the second resistor set 342.

To roughly examine the transfer function in FIG. 3A, assume C1=2C2=C3=C, and define $R_A=R_2//R_4//R_6$, and $R_B=R_3//R_5//R_7$. A resonance condition is R4=3·R5. Under the resonance condition, the transfer function according to the first embodiment may be obtained as shown in Equation 2 below.

$$TH = \frac{\alpha s^2 + \beta s + \gamma}{s\left[s^2 + \frac{2}{3C^2 R_5 R_B}\right]}$$ [Equation 2]

Herein, $$\alpha = \frac{1}{C}\left(\frac{4}{R_1} + \frac{1}{R_7} - \frac{1}{R_6}\right),$$

$$\beta = \frac{1}{C^2}\left[\frac{3}{R_1}\left(\frac{1}{R_4} + \frac{1}{R_B}\right) - \frac{2}{R_6 R_B}\right], \text{ and}$$

$$\gamma = \frac{2}{C^3 R_1}\left(\frac{1}{R_A}\right)\left(\frac{1}{R_B}\right).$$

Examining Equation 2, it can be seen that the transfer function of the loop filter 330a has the term $s^3$ in the denominator, so the loop filter is a third-order loop filter. In addition, it can be seen that the form is the same as that of Equation 1.

A loop filter using a single op-amp resonator (SOR) is capable of reducing the overall delay time, but may have performance degradation and a problem with stability due to excess loop delay (ELD). In particular, an SOR structure has fewer virtual ground nodes than a cascade structure, so it is difficult to solve these problems.

Referring to FIG. 3A, the loop filter 330a according to a modification of the first embodiment receives a feedback NRZ DAC signal through the inversion input terminal ($V_G$), which is a virtual ground, of the operational amplifier, and receives a RZ DAC signal for compensation for ELD through the second node ($V_B$). Herein, the second node ($V_B$) to which the RZ DAC signal input is not a complete virtual ground, so the gain-bandwidth value of the operational amplifier needs to be high for excellent compensation for excess loop delay (ELD).

FIG. 3B is a circuit diagram of a differential circuit illustrating the loop filter of the delta-sigma modulator for compensating for excess loop delay according to the first embodiment, the loop filter being realized using a single operational amplifier.

Referring to FIG. 3B, the elements of FIG. 3A are arranged symmetrical to each other, with the operational amplifier in the center. The elements connected to the inversion circuits in FIG. 3A are connected to the input or output (having the opposite phase of the input or output of the operational amplifier) that is the inverse of the input or output of the operational amplifier. The elements connected to the ground in FIG. 3A are placed between the upper circuit and the lower circuit of the operational amplifier.

Regarding the connection relationship of the elements placed above the operational amplifier in FIG. 3B, the positive input ($u_P'$) of the loop filter 330b is input to the $V_{GP}$ of the operational amplifier through the resistor $R_1$. The plurality of capacitors ($C_1$, $C_2$, and $C_3$) are placed between the positive input ($V_{GP}$) and the negative output ($v_N'$) of the operational amplifier.

Above the operational amplifier, the resistor $R_7$ of the second resistor set is connected to the positive input ($u_P'$), and the resistor $R_5$ of the second resistor set is connected to the positive output ($v_P'$) (having the opposite phase of the output connected to the capacitor $C_3$) that is the inverse of the output connected to the capacitor $C_3$. The resistor $R_3$ of the second resistor set is placed between the upper node $V^{BP}$ and the lower node $V^{BN}$, and may be placed divided by ½ above and below the operational amplifier.

Above the operational amplifier, the resistor $R_6$ of the first resistor set is connected to the negative input ($u_N'$) (having the opposite phase of the input of the resistor $R_7$) that is the inverse of the input of the resistor $R_7$ of the second resistor set, and the resistor $R_4$ of the first resistor set is connected to the negative output ($v_N'$) (having the opposite phase of the output of the resistor $R_5$) that is the inverse of the output of the resistor $R_5$ of the second resistor set. The resistor $R_2$ of the first resistor set is placed between the upper node $V_{AP}$ and the lower node $V_{AN}$, and may be placed divided by ½ above and below the operational amplifier.

Figure 4:
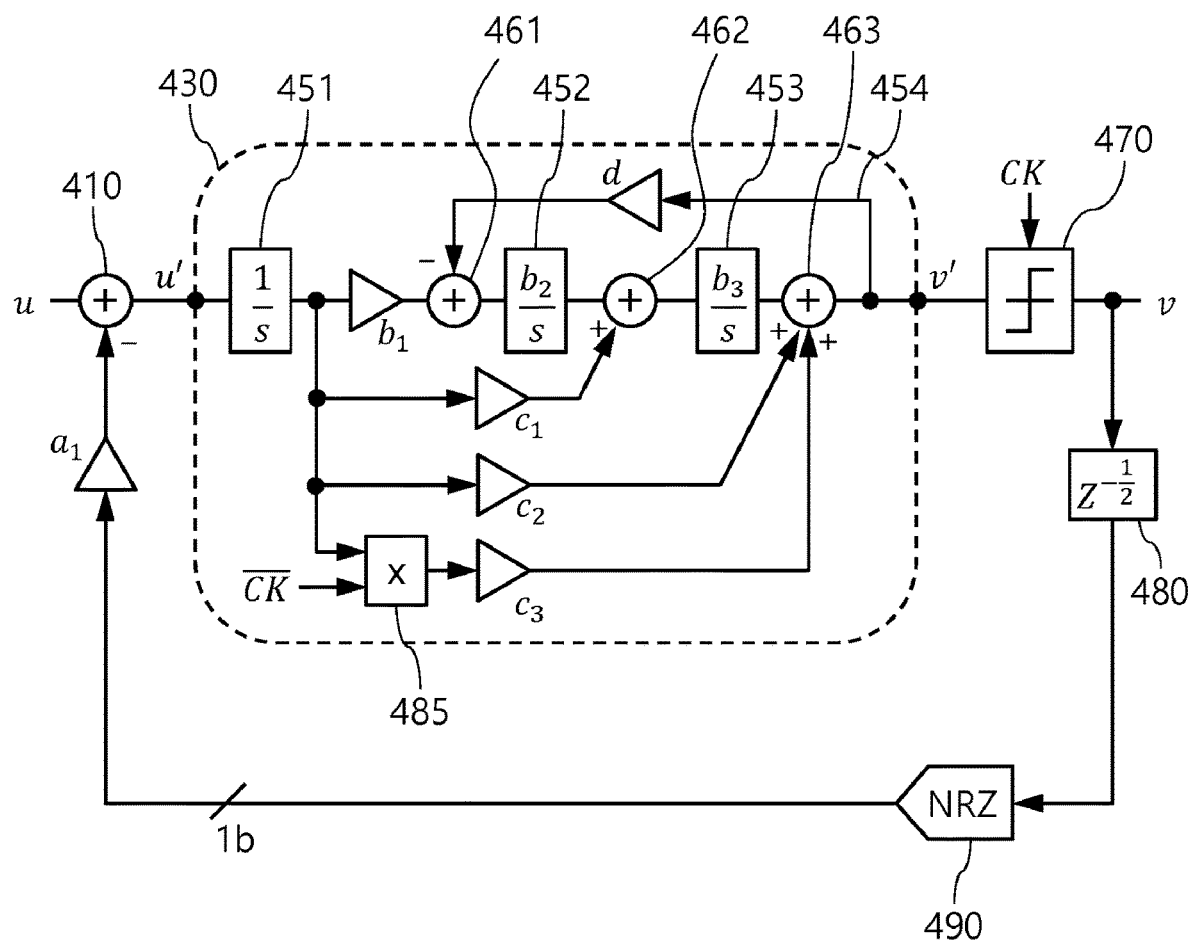
FIG. 4 is a configuration diagram illustrating the configuration of a delta-sigma modulator for compensating for excess loop delay according to a second embodiment.

FIG. 4 is a configuration diagram illustrating the configuration of a delta-sigma modulator for compensating for excess loop delay according to a second embodiment.

The return-to-zero (RZ) DAC of the first embodiment shown in FIG. 2 receives a signal half-clock delayed by the signal delay circuit 280, so performs a feedback operation only when the clock signal (CK) is low, or stays in a standby state when the CK is high. Therefore, the RZ feedback path may be converted into a feed forward (FF) path that is configured to operate selectively according to the clock signal (CK). That is, unlike the method of feeding back current to the RZ DAC 285 to compensate for excess loop delay (ELD) as shown in FIG. 2, the transfer function of the loop filter may be reconfigured according to clock signal (CK) in order to compensate for excess loop delay (ELD).

Referring to FIG. 4, the delta-sigma modulator (DSM) for compensating for excess loop delay (ELD) according to the second embodiment includes an adder 410, a loop filter 430, a quantizer 470, a signal delay circuit 480, and an NRZ DAC 490. When description is omitted to avoid duplication, reference may be made to a description of the corresponding configuration in FIG. 2.

The loop filter 430 further includes a switch circuit 485 that operates according to a clock signal (CK). The switch circuit 485 may be realized using a latch. The switch circuit 485 is configured to operate when receiving an inverted clock signal ($\overline{CK}$). When the clock signal is low, the switch circuit 485 amplifies a signal output from a first integrator 451 by $c_3$ times and outputs the amplified signal to a third adder 463. Herein, by comparing the loop equation of the circuit of FIG. 2, $c_3=a_2 b_3/a_1$ may be obtained. When the clock signal is high, the third adder 463 outputs an output signal (v') of the loop filter by adding the following signals: a signal output from a third integrator 453, and a signal obtained by amplifying a signal output from the first integrator 451 by $c_2$ times. When the clock signal is high, the third adder 463 outputs an output signal (v') of the loop filter by adding the following signals: the signal output from the third integrator 453, the signal obtained by amplifying the signal output from the first integrator 451 by $c_2$ times, and a signal obtained by amplifying the signal output from the first integrator 451 by $c_3$ times.

The delta-sigma modulator (DSM) for compensating for excess loop delay (ELD) according to the second embodiment may be realized using the loop filter 430 with a single op-amp resonator (SOR) and using the single NRZ DAC 490. Therefore, the delta-sigma modulator (DSM) according to second embodiment is capable of efficiently compensating for excess loop delay (ELD) by reducing power consumption.

Figure 5:
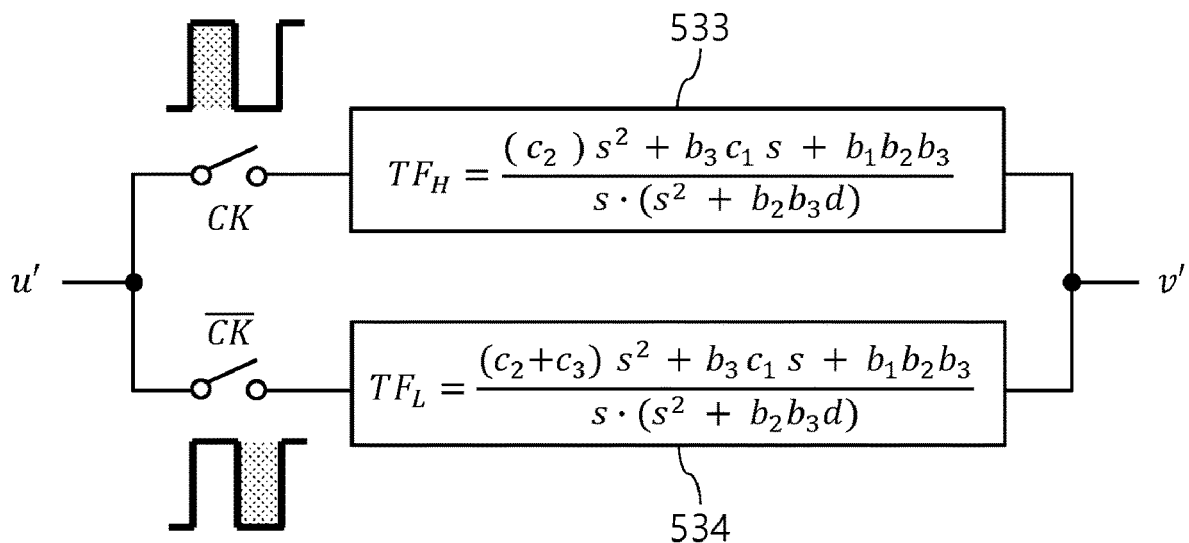
FIG. 5 is a conceptual diagram illustrating the loop filter of the delta-sigma modulator for compensating for excess loop delay according to the second embodiment, the loop filter being configured using a time division switching technique.

FIG. 5 is a conceptual diagram illustrating the loop filter of the delta-sigma modulator for compensating for excess loop delay according to the second embodiment, the loop filter being configured using a time division switching technique.

The time division switching (TDS) technique for compensating for excess loop delay (ELD) is not the conventional method of feeding current back, but performs compensation for excess loop delay (ELD) by reconfiguring the transfer function of the single op-amp resonator (SOR) according to the clock signal (CK). Using the time division switching (TDS) technique can improve power and area efficiency and enhance robustness against non-ideal situations.

In FIG. 4, the transfer function when the clock signal is high is determined as shown in Equation 3 below.

$$TH_H = \frac{(c_2)s^2 + b_3 c_1 s + b_1 b_2 b_3}{s(s^2 + b_2 b_3 d)} \quad \text{[Equation 3]}$$

In FIG. 4, the transfer function when the clock signal is low is determined as shown in Equation 4 below.

$$TH_L = \frac{(c_2 + c_3)s^2 + b_3 c_1 s + b_1 b_2 b_3}{s(s^2 + b_2 b_3 d)} \quad \text{[Equation 4]}$$

Accordingly, the loop filter 530 used in the delta-sigma modulator (DSM) for compensating for excess loop delay (ELD) according to the second embodiment of FIG. 4 may be represented as shown in FIG. 5. In FIG. 5, when the clock signal (CK) is high, the upper switch is connected and the transfer function 533 of Equation 3 is applied. When the clock signal (CK) is low, the lower switch is connected and the transfer function 534 of Equation 4 is applied. Comparing Equation 3 and Equation 4, the only difference is the coefficient of the second-order term ($s^2$) in the numerator of the transfer function.

Figure 6:
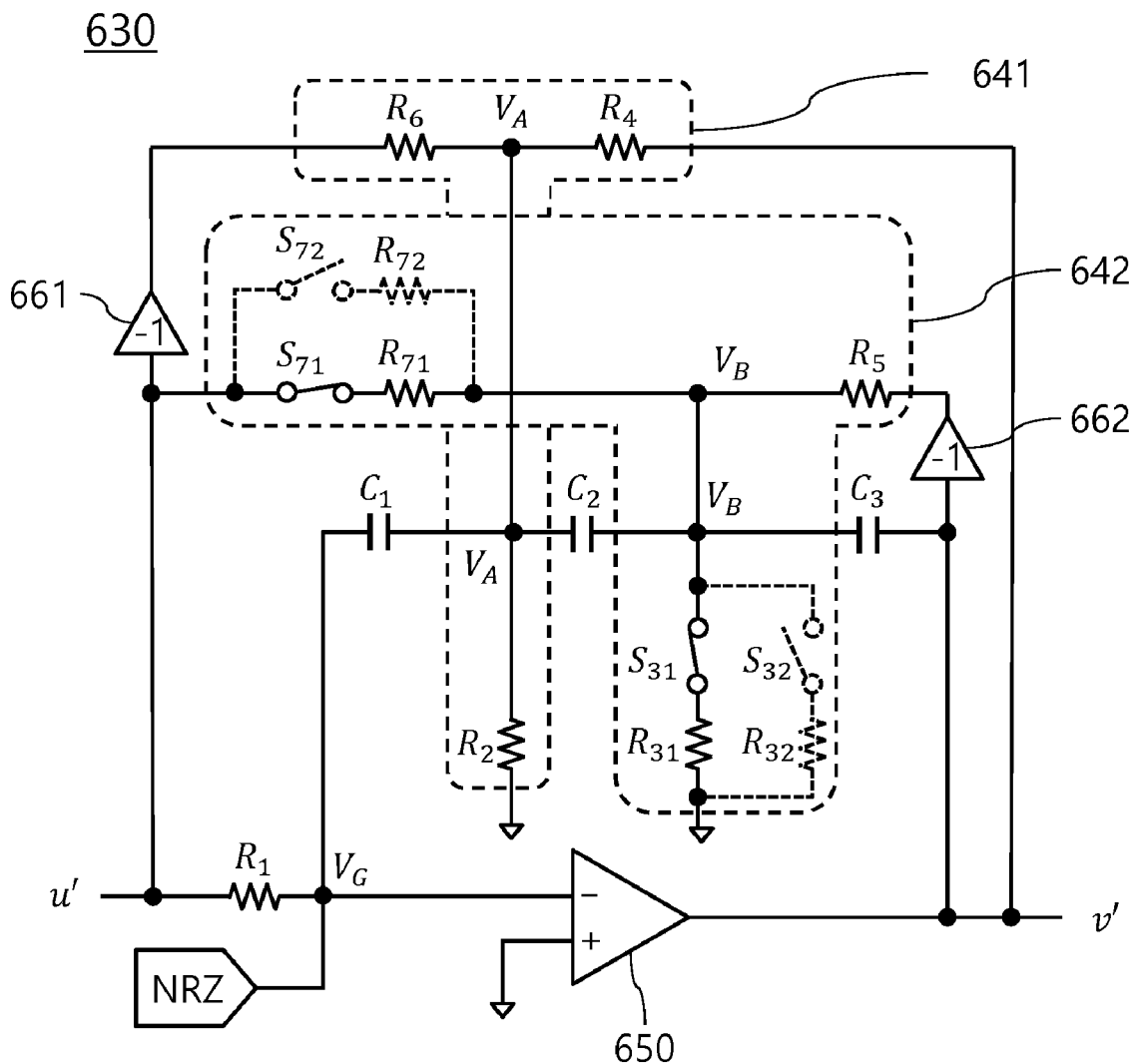
FIG. 6 is a single-ended circuit diagram illustrating the loop filter of the delta-sigma modulator for compensating for excess loop delay according to the second embodiment, the loop filter being realized using a time division switching technique.

FIG. 6 is a single-ended circuit diagram illustrating the loop filter of the delta-sigma modulator for compensating for excess loop delay according to the second embodiment, the loop filter being realized using a time division switching technique.

According to a modification of the second embodiment, a loop filter 630 used in the delta-sigma modulator (DSM) for compensating for excess loop delay (ELD) includes one operational amplifier 650, a first inversion circuit 661, a plurality of resistor units, a second inversion circuit 662, a first resistor ($R_1$), and a plurality of capacitors ($C_1$, $C_2$, and $C_3$).

The plurality of capacitors ($C_1$, $C_2$, and $C_3$) are connected to each other in series in that order between the inversion input terminal and the output terminal of the operational amplifier 650. The first resistor ($R_1$) is placed between the input terminal of the loop filter and the inversion input terminal of the operational amplifier. The plurality of resistor units are connected in common to any one of the nodes between the plurality of capacitors. The plurality of resistor units include a first resistor set 641 and a second resistor set 642.

The loop filter 630 receives an input signal (u') at the input terminal, and outputs an output signal (v') at the output terminal. When description is omitted to avoid duplication, reference may be made to a description of the corresponding configuration in FIG. 3A.

Referring to FIG. 6, the first resistor set 641 is placed between the inversion input terminal 661 of the loop filter and the output terminal (v') of the operational amplifier, and includes three resistor units connected to a first node ($V_A$) in common between a first capacitor ($C_1$) and a second capacitor ($C_2$) among the plurality of capacitors. A second resistor unit is placed between the first node ($V_A$) and the ground. A fourth resistor unit is placed between the first node ($V_A$) and the output terminal (v') of the operational amplifier. A sixth resistor unit is placed between the first node ($V_A$) and the inversion input terminal 661 of the loop filter.

Referring to FIG. 6, the second resistor set 642 is placed between the input terminal (u') of the loop filter and the inversion output terminal 662 of the operational amplifier, and includes three resistor units connected to a second node ($V_B$) in common between the second capacitor ($C_2$) and a third capacitor ($C_3$) among the plurality of capacitors. The second resistor set 642 includes: a third resistor unit placed between the second node ($V_B$) and the ground; a fifth resistor unit placed between the second node ($V_B$) and the output terminal of the second inversion circuit 662; and a seventh resistor unit placed between the input terminal of the loop filter and the second node ($V_B$). The clock signal changes the resistance values of the seventh resistor unit and the third resistor unit.

The fifth resistor unit includes a fifth resistor ($R_5$). The third resistor unit includes two switches ($S_{31}$ and $S_{32}$) and two resistors ($R_{31}$ and $R_{32}$). The seventh resistor unit includes two switches ($S_{71}$ and $S_{72}$) and two resistors ($R_{71}$ and $R_{72}$). The switches of the third resistor unit and the seventh resistor unit are connected to different resistors. The on/off operation of each of the switches is controlled by the clock signal (CK), and the resistance values of the third resistor unit and the seventh resistor unit are changed according to the operations of the switches.

Referring to Equation 2, resistors R1, R6, and R7 affect the coefficient of the second order term ($s^2$) in the numerator of the transfer function. Therefore, for compensation for ELD, in order to accurately realize the transfer function reconfigured for each clock cycle, several resistors affecting the coefficient of the second order term ($s^2$) in the numerator of the transfer function need to be adjusted simultaneously every clock cycle. However, this method needs to switch the several resistors every clock cycle, thus resulting in large power consumption.

To solve this problem, the loop filter 630 according to a modification of the second embodiment is configured such that the resistance value of the seventh resistor unit affecting the coefficient of the second order term ($s^2$) in the numerator of the transfer function is changed according to the clock signal (CK). When the loop filter is configured such that the resistance value ($R_7$) of the seventh resistor unit decreases when the clock signal (CK) is low, the coefficient of the second order term ($s^2$) in the numerator of the transfer function increases. Such configuration corresponds to the increase in the coefficient of the second order term ($s^2$) in the numerator of the transfer function in Equation 4 when the clock signal (CK) is low.

In this case, the value of the constant term ($s^0$) in the numerator of the transfer function increases. To prevent this, the resistance value ($R_3$) of the third resistor unit unrelated to the resonance condition is increased to offset the increase in the constant value. In the meantime, when excessive compensation is performed with the resistance value ($R_3$) of the third resistor unit, the signal-to-noise ratio is further improved. In this case, although the constant value of the transfer function is decreased, the maximum value of the signal transfer function is slightly increased and the overall performance is hardly affected. In the meantime, $R_4$ and $R_5$ for positive feedback are not changed, so the quality of a notch is also maintained.

According to another aspect, in the loop filter 630, resistance values of at least two of the plurality of resistor units are changed according to the clock signal. For example, in the loop filter 630, the resistance values of the seventh resistor unit and the third resistor unit, which are the two resistor units are changed according to the clock signal.

According to another aspect, in the loop filter 630, as resistance values of two of the plurality of resistor units are changed, the coefficient of the highest order term in the numerator of the third-order transfer function of the loop filter is changed. For example, in the loop filter 630, when the resistance values of the seventh resistor unit and the third resistor unit are changed, the coefficient of the highest order term in the numerator of the third-order transfer function of the loop filter is changed.

According to another aspect, the resistance value of one of the two resistor units of the loop filter 630 increases when the clock signal is high, or the resistance value of the other resistor unit increases when the clock signal is low. For example, when the clock signal is high, the resistance value ($R_7$) of the seventh resistor unit increases. When the clock signal is low, the resistance value of the third resistor unit increases. That is, with respect to the clock signal, the resistance values of the two resistor units are changed in opposite directions.

According to a further modification of the second embodiment, each of the two resistor units of the loop filter 630 includes a plurality of resistors and a switch that is connected to at least one of the plurality of resistors and determines a resistance value based on the clock signal. For example, the third resistor unit includes a plurality of resistors ($R_{31}$ and $R_{32}$) and switches ($S_{31}$ and $S_{32}$) that are connected to at least one of the plurality of resistors and determine a resistance value based on the clock signal. The seventh resistor unit includes a plurality of resistors ($R_{71}$ and $R_{72}$) and switches ($S_{71}$ and $S_{72}$) that are connected to at least one of the plurality of resistors and determine a resistance value based on the clock signal.

Referring to FIG. 6, when the clock signal is low, the lower switches ($S_{31}$ and $S_{71}$) are shorted and the upper switches ($S_{32}$ and $S_{72}$) are open. When the clock signal is low, the resistance value of the third resistor unit is large, so $R_{31} > R_{32}$. When the clock signal is high, the resistance value of the seventh resistor unit is large, so $R_{71} < R_{72}$.

The loop filter 630 according to a modification of the second embodiment has a signal transfer characteristic satisfying the third-order transfer function, and is capable of compensating for excess loop delay (ELD) using the time division switching (TDS) technique based on the clock signal (CK), and has good power and area efficiency by switching only two resistor units.

FIG. 6 shows the configuration in which resistors are arranged in parallel in the third resistor unit and the seventh resistor unit and a switch is connected to each of the resistors, but a modification in which a switch is connected to only one of the resistors connected in parallel is also possible. In addition, a further modification in which resistors are connected in series and a switch is connected to any one of the resistors or each of the resistors is also possible. In all the configurations according to the modifications, the transfer function of the loop filter is changed to Equation 3 or Equation 4 as the switch changes the resistance of each resistor unit according to the clock signal, thereby performing compensation for excess loop delay (ELD).

Figure 7:
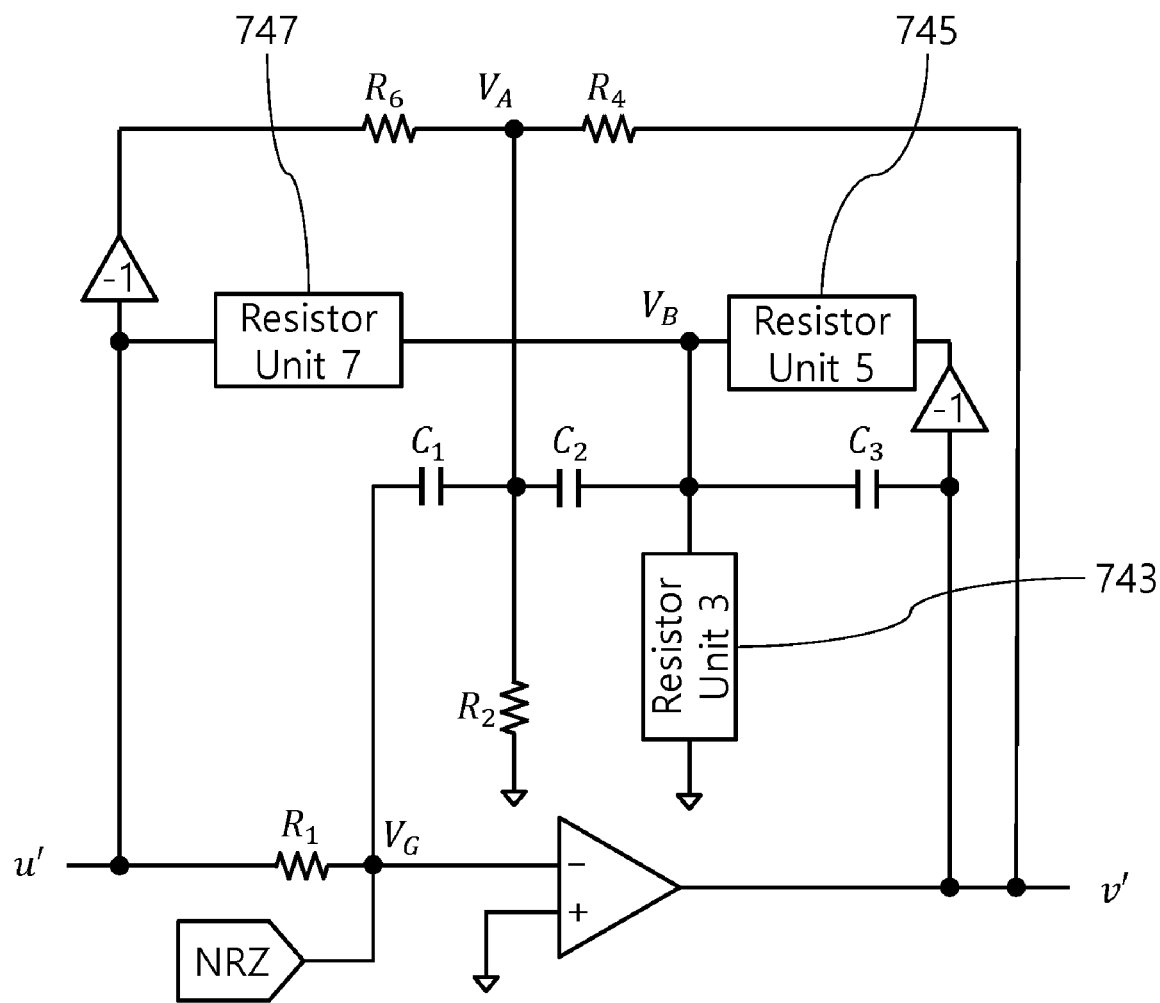
FIG. 7 is a single-ended circuit diagram illustrating the loop filter of the delta-sigma modulator for compensating for excess loop delay according to the second embodiment, the resistor units of the loop filter being represented as blocks.

FIG. 7 is a single-ended circuit diagram illustrating the loop filter of the delta-sigma modulator for compensating for excess loop delay according to the second embodiment, the resistor units of the loop filter being represented as blocks.

The switches $S_{31}$ and $S_{32}$ and the resistors $R_{31}$ and $R_{32}$ in FIG. 6 are represented as the third resistor unit 743, the resistor $R_5$ is represented as the fifth resistor unit 745, and the switches $S_{71}$ and $S_{72}$ and the resistors $R_{71}$ and $R_{72}$ are represented as the seventh resistor unit 747.

Referring to FIG. 7, the second resistor set of the loop filter 730 includes: the third resistor unit 733 placed between the second node ($V_B$) and the ground; the fifth resistor unit 735 connected to the second node ($V_B$) and the output terminal of the second inversion circuit 640; and the seventh resistor unit placed between the input terminal of the loop filter and the second node ($V_B$). The clock signal changes the resistance values of the seventh resistor unit 737 and the third resistor unit 733.

Figure 8A:
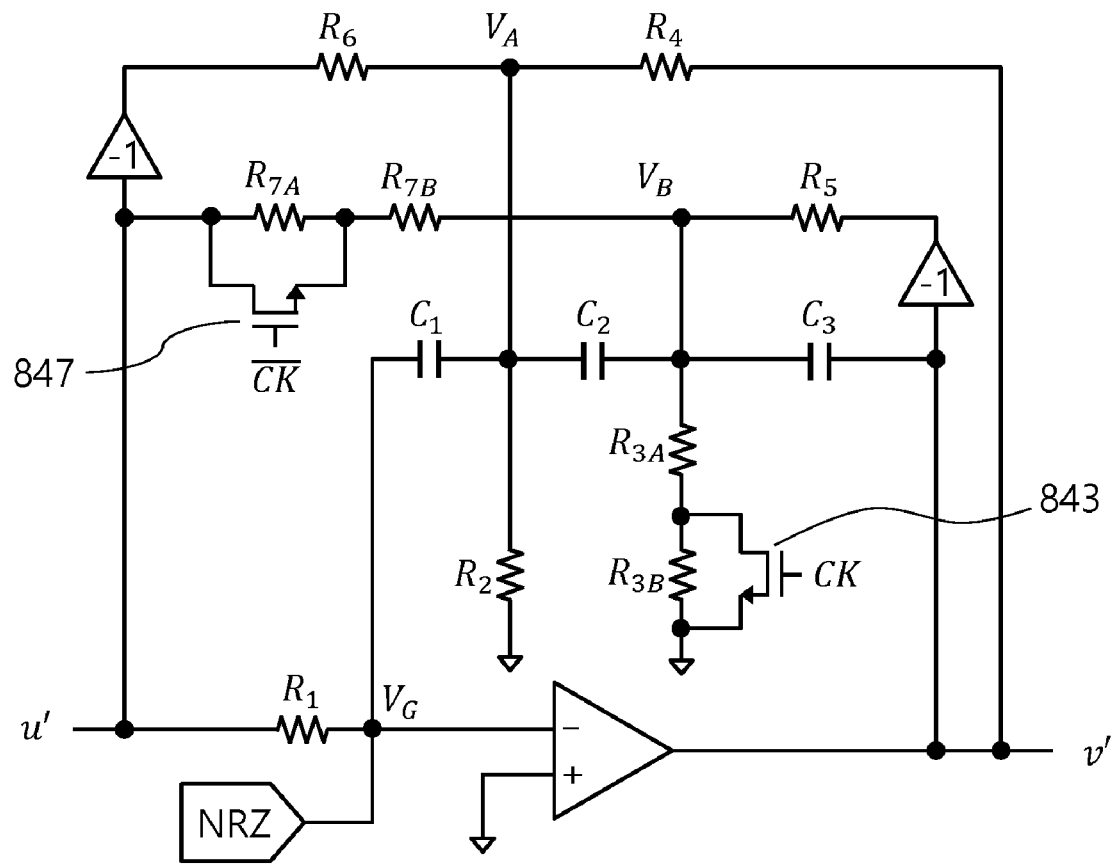
FIG. 8A is a single-ended circuit diagram illustrating the loop filter of the delta-sigma modulator for compensating for excess loop delay according to a modification of the second embodiment, the loop filter being realized using a MOSFET.

FIG. 8A is a single-ended circuit diagram illustrating the loop filter of the delta-sigma modulator for compensating for excess loop delay according to a modification of the second embodiment, the loop filter being realized using a MOSFET.

According to a further modification of the second embodiment, regarding two resistor units which are the third resistor unit and the seventh resistor unit in the loop filter 830a, the resistance value of each of the resistor units is changed according to the clock signal. Each of the two resistor units includes a plurality of resistors and one switch. The third resistor unit includes two resistors ($R_{3A}$ and $R_{3B}$), and the seventh resistor unit includes two resistors ($R_{7A}$ and $R_{7B}$). A first switch 843 of the third resistor unit has two terminals connected to the opposite ends of at least one resistor ($R_{3B}$) included in the third resistor unit. A second switch 847 of the seventh resistor unit has two terminals connected to the opposite ends of at least one resistor ($R_{7A}$) included in the seventh resistor unit. The first switch 843 and the second switch 847 are controlled by the clock signals, and one of the clock signals input to the first switch 843 and the second switch 847 is input in an inverted manner.

According to an additional aspect, two switches of two resistor units of the loop filter 830a may be configured using bipolar transistors or MOSFETS. For example, the first switch 843 and the second switch 847 may be manufactured using NMOS, PMOS, or CMOS. According to a modification of the embodiment, NMOS may be used for a switch to which a clock signal is input, and PMOS may be used for a switch to which an inverted clock signal is input.

According to an additional aspect, switches of two resistor units of the loop filter 830a may be realized using transistors. Two resistors among a plurality of resistors included in the two resistor units are connected in series, and one of the two resistors connected in series has the opposite ends connected to the two terminals of the switch (transistor). For example, the opposite ends of the resistor ($R_{3B}$) of the third resistor unit are connected to the source and drain electrodes of a first transistor 843, respectively. In addition, the opposite ends of the resistor ($R_{7A}$) of the seventh resistor unit are connected to the source and drain electrodes of a second transistor 847, respectively.

According to an additional aspect, for each of the two resistor units of the loop filter 830*a*, a plurality of resistors and a switch are connected in the same configuration, and the switch of one of the two resistor units receives a clock signal and the switch of the other resistor unit receives an inverted clock signal. For example, the third resistor unit and the seventh resistor unit have the same configuration in which two resistors are connected and a switch (transistor) is connected to one of the two resistors. In addition, the signal input to the seventh resistor unit is an inverted clock signal.

Referring to FIG. 8A, when the clock signal (CK) is high, the high signal is input to the first transistor 843 and the first transistor 843 operates, and as a result, the resistance of the third resistor unit becomes $R_{3A}$. The second transistor 847 receives the low signal inverted by the inversion circuit and the second transistor 847 does not operate, so the resistance of the seventh resistor unit becomes $R_{7A}+R_{7B}$ When the clock signal (CK) is low, the first transistor 843 does not operate, and as a result, the resistance of the third resistor unit becomes $R_{3A}+R_{3B}$. The high signal resulting from inverting the clock signal is input to the second transistor 847 and the second transistor 847 operates, so the resistance of the seventh resistor unit becomes $R_{7B}$.

That is, when the clock signal (CK) is turned high, the resistance of the third resistor unit decreases from $R_{3A}+R_{3B}$ to $R_{3A}$ and the resistance of the seventh resistor unit increases from $R_{7B}$ to $R_{7A}+R_{7B}$. As the resistance of the seventh resistor unit increases, the coefficient of the second order term in the numerator of the transfer function including the reciprocal of the resistance decreases. The decrease in the constant term in the numerator of the transfer function is compensated for by the increase in the reciprocal of the resistance due to the decrease in the resistance of the third resistor unit.

When the clock signal (CK) is turned low, the resistance of the third resistor unit increases from $R_{3A}$ to $R_{3A}+R_{3B}$ and the resistance of the seventh resistor unit decreases from $R_{7A}+R_{7B}$ to $R_{7B}$. As the resistance of the seventh resistor unit decreases, the coefficient of the second order term in the numerator of the transfer function increases. The constant term in the numerator of the transfer function is compensated for by the increase in the resistance of the third resistor unit.

When the clock signal (CK) that oscillates periodically between high and low is input to the loop filter 830*a* having the signal transfer characteristic satisfying the third-order transfer function, the increase or decrease in the resistance value of the third resistor unit and the increase or decrease in the resistance value of the seventh resistor unit change in opposite directions. As a result, the transfer function of the loop filter 830*a* is changed to enable compensation for excess loop delay (ELD).

According to an additional aspect, the delta-sigma modulator includes the loop filter that has the signal transfer characteristic satisfying the third-order transfer function and compensates for excess loop delay using the time division switching technique described above. The delta-sigma modulator (DSM) is capable of compensating for excess loop delay by using power efficiently.

According to an additional aspect, a communication terminal includes the delta-sigma modulator (DSM) capable of compensating for excess loop delay by using the time division switching technique described above. The delta-sigma modulator (DSM) includes the loop filter that has the signal transfer characteristic satisfying the third-order transfer function and compensates for excess loop delay.

Figure 8B:
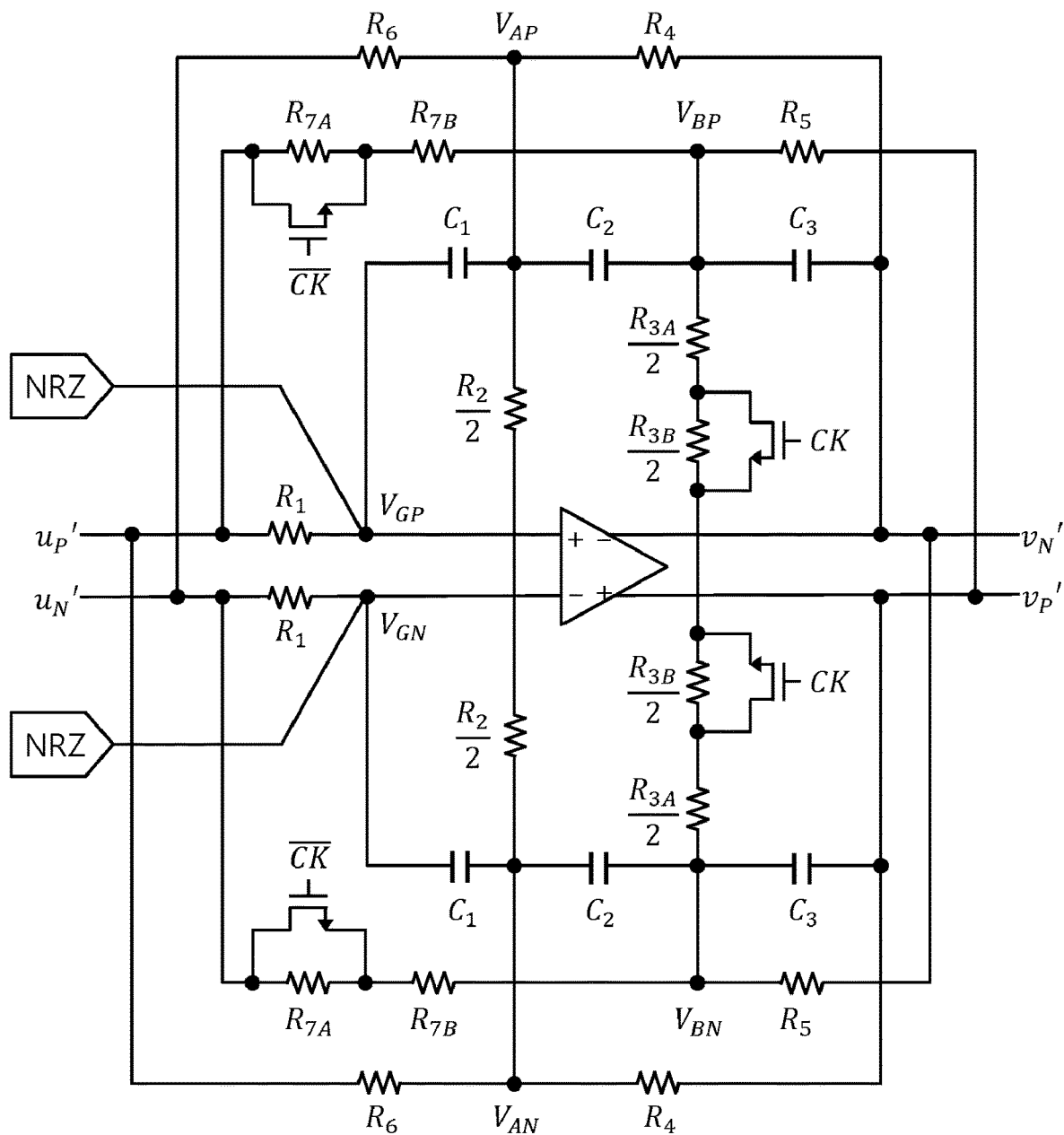
FIG. 8B is a circuit diagram of a differential circuit illustrating the loop filter of the delta-sigma modulator for compensating for excess loop delay according to a modification of the second embodiment, the loop filter being realized using the MOSFET.

FIG. 8B is a circuit diagram of a differential circuit illustrating the loop filter of the delta-sigma modulator for compensating for excess loop delay according to a modification of the second embodiment, the loop filter being realized using the MOSFET.

Referring to the differential circuit of FIG. 8B, similarly to the circuits of FIG. 3B, the elements of FIG. 8A are arranged symmetrical to each other, with the operational amplifier in the center. The elements connected to the inversion circuits in FIG. 8A are connected to the input or output (having the opposite phase) that is the inverse of the input or output of the operational amplifier. The elements connected to the ground in FIG. 8A are placed between the upper circuit and the lower circuit of the operational amplifier.

Above the operational amplifier, the first switch (transistor) to which the clock signal (CK) is input is connected to the resistor $R_3/2$ of the second resistor set, and the second switch (transistor) to which the inverted clock signal ($\overline{CK}$) is input is connected to the resistor $R_{7A}$ of the second resistor set. At the lower elements of the operational amplifier, the first switch and the second switch are arranged symmetrically to the upper elements.

Figure 9:
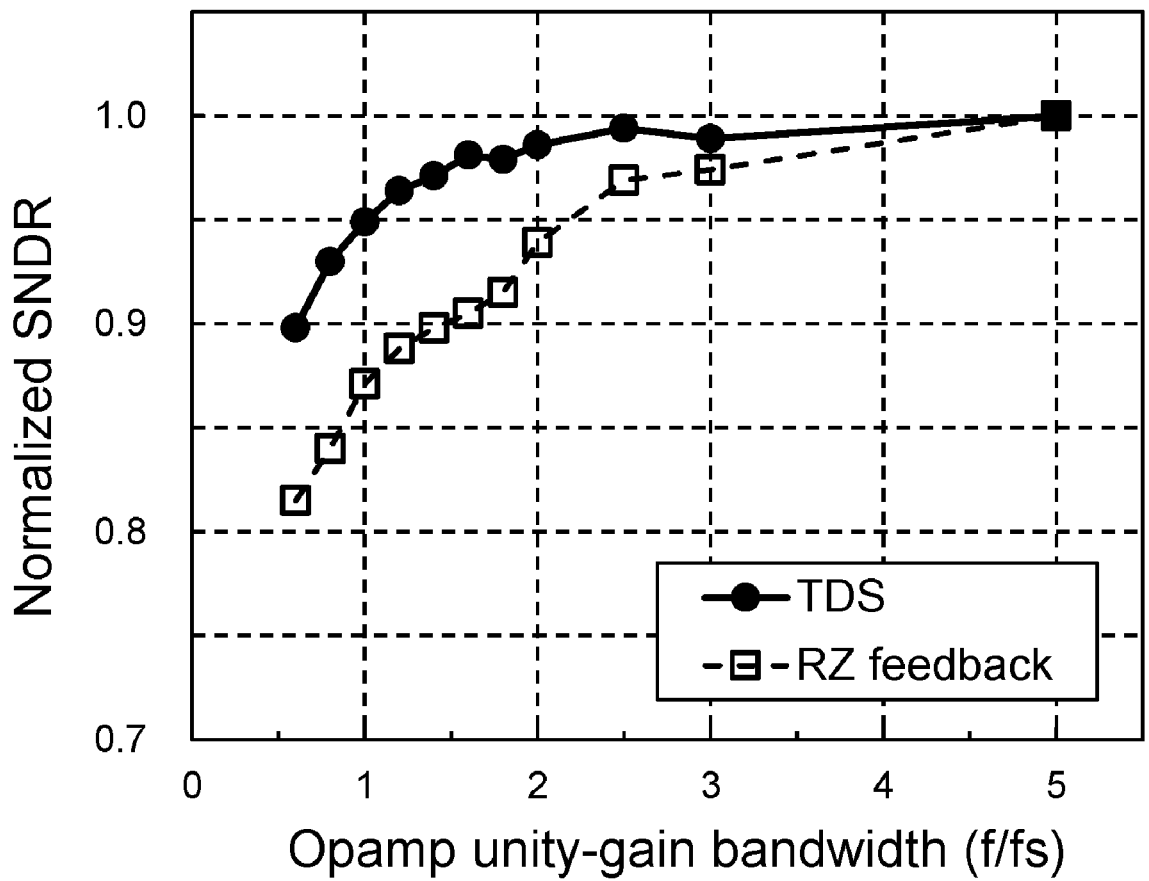
FIG. 9 is a graph illustrating a signal-to-noise ratio attenuation characteristic for the unity-gain bandwidth of the delta-sigma modulator according to the second embodiment.

FIG. 9 is a graph illustrating a signal-to-noise ratio attenuation characteristic for the unity-gain bandwidth of the delta-sigma modulator according to the second embodiment.

In the graph, the horizontal axis represents the unity-gain bandwidth (UGBW) of the operational amplifier in terms of sampling frequency (fs). The vertical axis represents the normalized signal-noise distortion ratio (SNDR). The hollow squares denote a result of the delta-sigma modulator (DSM) including the loop filter that compensates for excess loop delay by using the RZ DAC feedback according to the first embodiment of FIGS. 2 to 3B. The black circles denote a result of the delta-sigma modulator (DSM) including the loop filter that compensates for excess loop delay by using the time division switching (TDS) technique according to the second embodiment of FIGS. 4 to 8B.

More power is consumed to increase the unity-gain bandwidth (UGBW) of the operational amplifier. Therefore, in the graph, a low unity-gain bandwidth (UGBW) for the same SNDR value has a low power consumption characteristic.

Referring to the SNDR value of about 0.97 in FIG. 9, the unity-gain bandwidth (UGBW) was about 1.2 when the time division switching (TDS) technique was used, and the unity-gain bandwidth (UGBW) was about 2.5 when the RZ DAC feedback was used. Accordingly, for the same SNDR value, the case of using the time division switching (TDS) technique shows a lower unity-gain bandwidth (UGBW), so it can be seen that the loop filter and the delta-sigma modulator (DSM) using the time division switching (TDS) technique have lower power consumption.

Figure 10:
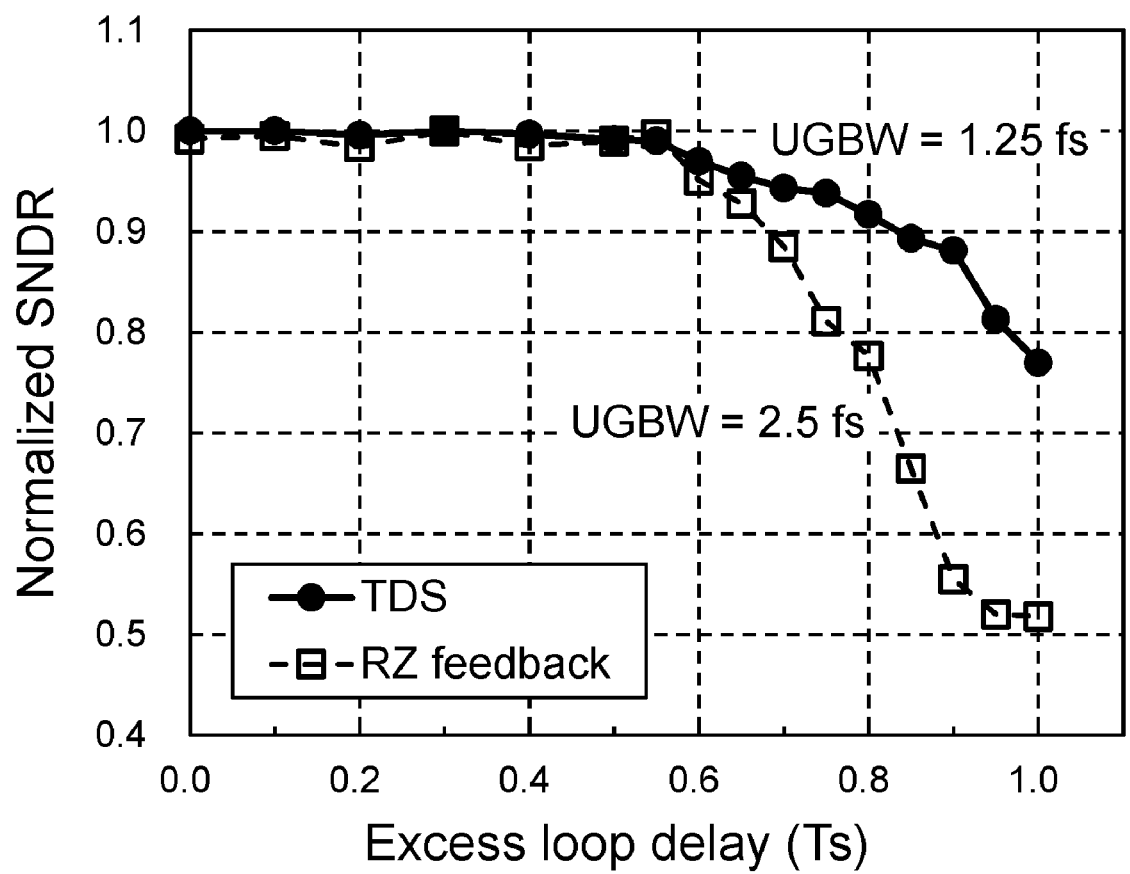
FIG. 10 is a graph illustrating a signal-to-noise ratio attenuation characteristic for excess loop delay of the delta-sigma modulator according to the second embodiment.

FIG. 10 is a graph illustrating signal-to-noise ratio attenuation characteristic for excess loop delay of the delta-sigma modulator according to the second embodiment.

In the graph, the horizontal axis represents excess loop delay (ELD) and the vertical axis represents the normalized signal-noise distortion ratio (SNDR). The hollow squares denote a result of the delta-sigma modulator (DSM) including the loop filter that compensates for excess loop delay by using the RZ DAC feedback. The black circles denote a result of the delta-sigma modulator (DSM) including the loop filter that compensates for excess loop delay by using the time division switching (TDS) technique.

To have the same SNDR value in the absence of excess loop delay (ELD), the delta-sigma modulator (DSM) using the time division switching (TDS) technique used the unity-gain bandwidth (UGBW) that was 1.25 times the sampling frequency (fs), and the delta-sigma modulator (DSM) using the RZ DAC feedback used the unity-gain bandwidth (UGBW) that was 2.5 times the sampling frequency (fs).

In FIG. 10, when excess loop delay (ELD) was smaller than 0.6 times the sampling period (Ts), the SNDR showed a good value, but when excess loop delay (ELD) was greater than 0.6 time the sampling period (Ts), the SNDR decreased gradually. The case of using the time division switching (TDS) technique showed higher SNDR even when excess loop delay (ELD) was greater than the case of using the RZ DAC feedback. Therefore, the case of using the time division switching (TDS) technique showed a better characteristic for the signal-to-noise ratio attenuation when great excess loop delay (ELD) occurred than the case of using the RZ DAC feedback.

Although the present disclosure has been described through the embodiment with reference to the accompanying drawings, the present disclosure is not limited thereto, and should be understood to encompass various modifications which may be clearly derived by those skilled in the art. The claims are intended to encompass these modifications.

What is claimed is:

1. A loop filter compensating for excess loop delay and having a signal transfer characteristic satisfying a third-order transfer function, the loop filter comprising:
   an operational amplifier;
   a plurality of capacitors connected to each other in series between an input terminal and an output terminal of the operational amplifier; and
   a plurality of resistor units connected in common to one among nodes between the plurality of capacitors,
   wherein at least two of the plurality of resistor units have respective resistance values changed according to a clock signal,
   wherein each of the two resistor units comprises:
     a plurality of resistors; and
     a switch connected to at least one of the plurality of resistors, and configured to determine the resistance value based on the clock signal.

2. The loop filter of claim 1, wherein as the resistance values of the two resistor units are changed, a coefficient of the highest degree of a polynomial in a numerator of the third-order transfer function of the loop filter is changed.

3. The loop filter of claim 1, wherein the resistance value of one of the two resistor units is changed to increase when the clock signal is high, or the resistance value of the other resistor unit is changed to increase when the clock signal is low.

4. The loop filter of claim 1, wherein for each of the two resistor units, the plurality of resistors and the switch are connected in the same configuration, and
   the switch of one of the two resistor units receives the clock signal, and the switch of the other resistor unit receives an inverted clock signal.

5. The loop filter of claim 1, wherein two of the plurality of resistors included in each of the two resistor units are connected in series, and
   one of the two resistors connected in series in each of the resistor units has opposite ends connected to two terminals of the switch of each of the resistor units.

6. The loop filter of claim 1, wherein the plurality of resistor unit comprise:
   a first resistor set placed between an inversion input terminal of the loop filter and the output terminal of the operational amplifier, and including three resistor units connected to a first node in common between a first capacitor and a second capacitor among the plurality of capacitors; and
   a second resistor set placed between an input terminal of the loop filter and an inversion output terminal of the operational amplifier, and including three resistor units connected to a second node in common between the second capacitor and a third capacitor among the plurality of capacitors.

7. The loop filter of claim 6, wherein the second resistor set comprises:
   a third resistor unit placed between the second node and a ground;
   a fifth resistor unit connected to the second node and the inversion output terminal of the operational amplifier; and
   a seventh resistor unit placed between the second node and the input terminal of the loop filter,
   wherein the clock signal changes the resistance values of the seventh resistor unit and the third resistor unit.

8. The loop filter of claim 7, wherein the third resistor unit and the seventh resistor unit comprises:
   the plurality of resistors; and
   the switch connected to at least one of the plurality of resistors, and configured to determine the resistance value based on the clock signal.

9. The loop filter of claim 8, wherein a first switch of the third resistor unit has two terminals connected to opposite ends of at least one resistor included in the third resistor unit,
   a second switch of the seventh resistor unit has two terminals connected to opposite ends of at least one resistor included in the seventh resistor unit,
   the first switch and the second switch are controlled by the clock signals, and
   one of the clock signals input to the first switch and the second switch is input in an inverted manner.

10. A delta-sigma modulator, comprising:
    a loop filter compensating for excess loop delay and having a signal transfer characteristic satisfying a third-order transfer function, and configured to integrate a difference between an input signal and an analog signal for output;
    a quantizer configured to quantize a signal output from the loop filter for output; and
    a digital-to-analog converter (DAC) configured to perform digital-to-analog conversion on a signal output from the quantizer to output the analog signal,
    wherein the loop filter comprises:
    an operational amplifier;
    a plurality of capacitors connected to each other in series between an input terminal and an output terminal of the operational amplifier; and
    a plurality of resistor units connected in common to one among nodes between the plurality of capacitors,
    wherein at least two of the plurality of resistor units have respective resistance values changed according to a clock signal,
    wherein each of the two resistor units comprises:
      a plurality of resistors; and
      a switch connected to at least one of the plurality of resistors, and configured to determine the resistance value based on the clock signal.

11. The delta-sigma modulator of claim 10, wherein as the resistance values of the two resistor units are changed, a coefficient of the highest degree of a polynomial in a numerator of the third-order transfer function of the loop filter is changed.

12. The delta-sigma modulator of claim 10, wherein the resistance value of one of the two resistor units is changed to increase when the clock signal is high, or the resistance value of the other resistor unit is changed to increase when the clock signal is low.

13. The delta-sigma modulator of claim 10, wherein for each of the two resistor units, the plurality of resistors and the switch are connected in the same configuration,
the switch of one of the two resistor units receives the clock signal, and the switch of the other resistor unit receives an inverted clock signal.

14. The delta-sigma modulator of claim 10, wherein two of the plurality of resistors included in each of the two resistor units are connected in series, and
one of the two resistors connected in series in each of the resistor units has opposite ends connected to two terminals of the switch of each of the resistor units.

15. A communication terminal comprising a delta-sigma modulator capable of compensating for excess loop delay by using a time division switching technique,
wherein the delta-sigma modulator comprises a loop filter compensating for the excess loop delay and having a signal transfer characteristic satisfying a third-order transfer function,
wherein the loop filter comprises:
an operational amplifier;
a plurality of capacitors connected to each other in series between an input terminal and an output terminal of the operational amplifier; and
a plurality of resistor units connected in common to one among nodes between the plurality of capacitors,
wherein at least two of the plurality of resistor units have respective resistance values changed according to a clock signal,
wherein each of the two resistor units comprises:
a plurality of resistors; and
a switch connected to at least one of the plurality of resistors, and configured to determine the resistance value based on the clock signal.

16. The communication terminal of claim 15, wherein as the resistance values of the two resistor units are changed, a coefficient of the highest degree of a polynomial in a numerator of the third-order transfer function of the loop filter is changed.

17. The communication terminal of claim 15, wherein the resistance value of one of the two resistor units is changed to increase when the clock signal is high, or the resistance value of the other resistor unit is changed to increase when the clock signal is low.

* * * * *